(12) United States Patent
Tomonaga et al.

(10) Patent No.: US 7,270,765 B2
(45) Date of Patent: Sep. 18, 2007

(54) COMPOSITION FOR FORMING DIELECTRIC LAYER, MIM CAPACITOR AND PROCESS FOR ITS PRODUCTION

(75) Inventors: Hiroyuki Tomonaga, Yokohama (JP); Katsuaki Miyatani, Yokohama (JP); Yoshihisa Beppu, Yokohama (JP); Kumiko Takahashi, Yokohama (JP); Kazuo Sunahara, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/150,231

(22) Filed: Jun. 13, 2005

(65) Prior Publication Data

US 2006/0001069 A1    Jan. 5, 2006

(30) Foreign Application Priority Data

Jun. 14, 2004    (JP) .............................. 2004-175676

(51) Int. Cl.
*H01L 29/12* (2006.01)
*H01L 21/8242* (2006.01)
*H01L 27/108* (2006.01)
*C04B 35/00* (2006.01)

(52) U.S. Cl. .................. 252/62.3 BT; 252/62.3 R; 438/240; 438/238; 438/239; 438/778; 438/780; 438/781; 438/785; 438/787; 438/790; 257/296; 257/306

(58) Field of Classification Search ......... 252/62.3 BT
See application file for complete search history.

(56) References Cited

U.S. PATENT DOCUMENTS

| | | | |
|---|---|---|---|
| 5,165,076 A * | 11/1992 | Tsuboyama et al. ........ 349/184 |
| 6,126,743 A * | 10/2000 | Saegusa et al. ................ 117/68 |
| 6,586,513 B1 * | 7/2003 | Goto et al. .................. 524/399 |
| 6,808,670 B2 * | 10/2004 | Kawabe et al. ............. 264/433 |
| 6,908,960 B2 * | 6/2005 | Takaya et al. .............. 524/494 |
| 2002/0132898 A1 * | 9/2002 | Takaya et al. .............. 524/445 |
| 2003/0005723 A1 * | 1/2003 | Kawabe et al. ............. 65/17.2 |
| 2003/0207135 A1 * | 11/2003 | Goto et al. ............. 428/473.5 |
| 2005/0130446 A1 * | 6/2005 | Takaya et al. .............. 438/780 |
| 2005/0154110 A1 * | 7/2005 | Takaya et al. .............. 524/413 |
| 2005/0276934 A1 * | 12/2005 | Fukui et al. ................ 428/32.6 |

FOREIGN PATENT DOCUMENTS

| JP | 2003-7135 | 1/2003 |
|---|---|---|
| JP | 2003-11270 | 1/2003 |

* cited by examiner

*Primary Examiner*—Joseph D. Anthony
(74) *Attorney, Agent, or Firm*—Oblon, Spivak, McClelland, Maier & Neustadt, P.C.

(57) ABSTRACT

To provide a composition for forming a dielectric layer excellent in dielectric constant and withstand voltage properties, a MIM capacitor and a process for its production.

A composition for forming a dielectric layer, which comprises fine particles of perovskite type dielectric crystal, glass frit, and a hydrolysable silicon compound or its oligomer, and a MIM capacitor comprising a substrate, and a bottom electrode layer, a dielectric layer having a structure such that fine particles of perovskite type dielectric crystal are dispersed in a silicon oxide matrix containing glass-forming ions and a top electrode, formed on the substrate in this order.

8 Claims, No Drawings

COMPOSITION FOR FORMING DIELECTRIC LAYER, MIM CAPACITOR AND PROCESS FOR ITS PRODUCTION

BACKGROUND OF THE INVENTION

1. Field of the Invention

The present invention relates to a composition for forming a dielectric layer, a MIM capacitor and a process for its production.

2. Discussion of Background

In recent years, a composition for forming a dielectric layer has been used to prepare by a coating method a dielectric layer for a MIM (Metal-Insulator-Metal) capacitor wherein a dielectric layer containing a dielectric material having a high dielectric constant such as a barium titanate type or a lead titanate type, is sandwiched between bottom and top electrodes made of conductive films of metal, etc., or a dielectric layer to be used for stabilizing the voltage applied to a luminescent layer in an electroluminescence device. Further, in a high frequency device, a composition for forming a dielectric layer is utilized also as a material for preparing a hybrid substrate, since the electric length can thereby be reduced.

As a conventional composition for forming a dielectric layer, a composition having fluidity comprising fine particles of dielectric crystal, glass frit and an organic vehicle, was used, and such a composition was applied to a substrate by e.g. screen printing or a doctor blade method, then dried to remove the organic vehicle and fired to melt the glass frit thereby to obtain a substrate provided with a dielectric layer. However, there was a problem such that if a large amount of glass frit was mixed in order to obtain a dense dielectric layer, the dielectric constant tended to deteriorate, and on the other hand, if the amount of glass frit was reduced, many pores tended to form in the dielectric layer, again leading to deterioration of the dielectric constant. Further, especially in a case where fine particles of lead type dielectric crystal were to be employed, lead would diffuse into the glass frit during firing at a high temperature, and in a case where the content of glass frit was large, decomposition of the dielectric crystal was likely to take place.

In order to solve such problems, Patent Document 1 discloses a process for obtaining a MIM capacitor having a dielectric layer having a construction such that fine particles of dielectric crystal are bonded by using a composition for forming a dielectric layer containing as a binder a hydrophobic resin such as an epoxy resin, an acrylic resin or a polyimide resin. However, there was a problem such that it was difficult to obtain a thick (particularly one having a layer thickness of at least 1 μm) and dense dielectric layer by using a binder containing such a resin as the main component, and it was difficult to obtain sufficient withstand voltage properties or dielectric constant.

On the other hand, Patent Document 2 discloses a composition for forming a dielectric layer comprising fine particles of dielectric crystal and a hydrolysable silicon compound. If such a composition is employed, it is possible to form a dielectric layer by firing at a low temperature of at most 500° C., and it is also possible to improve the dimensional precision of the dielectric layer. However, it was difficult to form a dense dielectric layer by using only the hydrolysable silicon compound as the binder. Further, it was likely that due to the crosslinking shrinkage of the hydrolysable silicon compound, cracks or pinholes were likely to form in the dielectric layer, whereby the withstand voltage tended to decrease, and depending upon the firing temperature, a problem of warpage of the substrate or the like was likely to result.

Patent Document 1: JP-A-2003-11270
Patent Document 2: JP-A-2003-7135

SUMMARY OF THE INVENTION

In view of the above-mentioned problems of the prior art, it is an object of the present invention to provide a composition for forming a dielectric layer which is capable of improving the withstand voltage properties and the dielectric constant properties without bringing about cracks or pinholes in the layer, a MIM capacitor and a process for its production.

The present invention provides the following:

(1) A composition for forming a dielectric layer, which comprises fine particles of perovskite type dielectric crystal, glass frit, and a hydrolysable silicon compound or its oligomer.

(2) The composition for forming a dielectric layer according to (1), wherein the fine particles of perovskite type dielectric crystal are made of at least one member selected from the group consisting of $Pb(Mg_{1/3}Nb_{2/3})O_3$, $PbTiO_3$, $PbZrO_3$, $BaTiO_3$, $SrTiO_3$ and solid solutions thereof.

(3) The composition for forming a dielectric layer according to (1), wherein the glass frit contains at least two oxides selected from the group consisting of silicon oxide, lead oxide, bismuth oxide, boron oxide, aluminum oxide and zinc oxide.

(4) The composition for forming a dielectric layer according to (1), wherein the hydrolysable silicon compound is a hydrolysable silicon compound having a Si—C bond, or its oligomer.

(5) The composition for forming a dielectric layer according to (1), wherein the ratio of the content, calculated as oxide, of the fine particles of the dielectric crystal, to the content, calculated as oxide, of the glass frit and the content, calculated as $SiO_2$, of the silicon compound, is [fine particles of dielectric crystal]/[glass frit+silicon compound]=95/5 to 50/50.

(6) The composition for forming a dielectric layer according to (1), wherein the ratio of the content, calculated as oxide, of the glass frit to the content, calculated as $SiO_2$, of the silicon compound, is [glass frit]/[silicon compound]=5/95 to 50/50.

(7) The composition for forming a dielectric layer according to (5), wherein the ratio of the content, calculated as oxide, of the glass frit to the content, calculated as $SiO_2$, of the silicon compound, is [glass frit]/[silicon compound]=5/95 to 50/50.

(8) The composition for forming a dielectric layer according to (1), which further contains a liquid medium.

(9) A MIM capacitor comprising a substrate, and a bottom electrode layer, a dielectric layer having a structure such that fine particles of perovskite type dielectric crystal are dispersed in a silicon oxide matrix containing glass-forming ions and a top electrode, formed on the substrate in this order.

(10) The MIM capacitor according to (9), wherein the substrate is a glass substrate.

(11) The MIM capacitor according to (9), wherein the dielectric layer has a layer thickness of from 1 to 50 μm.

(12) The MIM capacitor according to (9), wherein the matrix contains a Si—C bond.

(13) The MIM capacitor according to (9), wherein the glass-forming ions are ions of at least two types selected from the group consisting of lead, bismuth, boron, aluminum and zinc.

(14) A process for producing a MIM capacitor having two electrode layers and a dielectric layer sandwiched between the electrode layers, on a substrate, which comprises the following steps A to C in this order:

Step A: a step of forming a bottom electrode layer on a substrate,

Step B: a step of applying the composition for forming a dielectric layer as defined in claim 1, drying it and then firing it at a temperature of from 300 to 1,000° C. to form silicon oxide, thereby to form a dielectric layer having a structure such that fine particles of perovskite type dielectric crystal are dispersed in a silicon oxide matrix containing glass-forming ions, and Step C: a step of forming a top electrode layer.

(15) The process for producing a MIM capacitor according to (14), wherein the dielectric layer has a layer thickness of from 1 to 50 μm.

(16) The process for producing a MIM capacitor according to (14), wherein the matrix contains a Si—C bond.

(17) The process for producing a MIM capacitor according to (14), wherein the glass-forming ions are ions of at least two types selected from the group consisting of lead, bismuth, boron, aluminum and zinc.

By using the composition for forming a dielectric layer of the present invention, it is possible to simply obtain a MIM capacitor having both high withstand voltage properties and dielectric constant. Particularly, even when the dielectric layer is thick, no cracks are likely to form, and even if firing is carried out at a high temperature, no warpage of the substrate is likely to result. Accordingly, its application to various devices including inorganic electroluminescence devices can be expected.

DETAILED DESCRIPTION OF THE PREFERRED EMBODIMENTS

In the present invention, fine particles of perovskite type dielectric crystal (hereinafter sometimes referred to simply as fine particles of dielectric crystal) are made of a dielectric material having a perovskite type crystal structure represented by the formula $ABO_3$. Specifically, it is preferred to employ at least one member selected from the group consisting of $Pb(Mg_{1/3}Nb_{2/3})O_3$, $PbTiO_3$, $PbZrO_3$, $BaTiO_3$, $SrTiO_3$ and solid solutions thereof. The average particle size of such fine particles of dielectric crystal is not particularly limited, but it is preferably from 10 to 1,000 nm.

Next, it is important that the composition for forming a dielectric layer of the present invention contains glass frit. This glass frit fuses and acts as a binder for the fine particles of dielectric crystal, when fired in the process for forming the dielectric layer. In the present invention, it is preferred to employ, as the glass frit, one containing at least two oxides selected from the group consisting of silicon oxide, lead oxide, bismuth oxide, boron oxide, aluminum oxide and zinc oxide, and the firing temperature and the binding property may be adjusted by controlling the composition. Further, the softening point of the glass frit is preferably from 500 to 700° C., whereby the adhesion with the substrate and the properties as a binder can easily be obtained.

Further, the composition for forming a dielectric layer of the present invention contains a silicon compound which forms a siloxane bond by a sol-gel method (hereinafter sometimes referred to simply as a silicon compound). This silicon compound is a component which becomes a silicon oxide matrix upon condensation by firing, and such a silicon oxide matrix will serve as a binder for the fine particles of dielectric crystal in the same manner as the above-mentioned glass frit and has a function to improve the withstand voltage properties of the dielectric layer. Here, the silicon oxide is not required to have the exact composition of $SiO_2$ and may be present as an amorphous component having a network structure of a siloxane bond.

In the present invention, as such a silicon compound, a hydrolysable silicon compound or its oligomer may be used. Particularly, it is preferred to employ a hydrolysable silicon compound represented by the formula $R_aSi(R')_{4-a}$ or its oligomer. Otherwise, it is also possible to use a silicon compound capable of becoming silicon oxide, such as silazane.

In the above formula, R is an organic group having a carbon atom directly bonded to the silicon atom, and it is preferably a $C_{1-8}$ alkyl group, particularly preferably a $C_{1-4}$ alkyl group, most preferably a methyl group. R' is a hydrolysable group, and it is preferably an organic group having an oxygen atom or a nitrogen atom directly bonded to the silicon atom, a halogen atom or an amino group. The organic group having an oxygen atom directly bonded to the silicon atom is preferably a $C_{1-8}$ alkoxy group or an acyl group, and the organic group having a nitrogen atom directly bonded to the silicon atom is preferably an alkylamino group or an isocyanate group. R' is preferably a $C_{1-4}$ alkoxy group, particularly preferably a methoxy group or an ethoxy group. Symbol a is an integer of from 0 to 2, particularly preferably 0 or 1. In the case of a mixture of at least two types of the above compounds, the average of a may not be an integer. In a case where a is 2, two R may be different, and two to four R' may also be different from one another. However, a plurality of R and a plurality of R' are usually the same groups, respectively.

The silicon compound represented by the above formula may, for example, be a tetraalkoxysilane such as tetramethoxysilane, tetraethoxysilane or tetraisopropoxysilane, an alkyltrialkoxysilane such as methyltrimethoxysilane, methyltriethoxysilane, methyltriisopropoxysilane, ethyltrimethoxysilane, ethyltriethoxysilane or n-butyltrimethoxysilane, or a dialkylakoxysilane such as dimethyldimethoxysilane or dimethyldiethoxysilane.

The oligomer of the above hydrolysable silicon compound is an oligomer obtainable by partial hydrolytic condensation of a hydrolysable silicon compound, and its condensation degree is not particularly limited, but it is preferably an oligomer having a condensation degree of a level such that it is liquid or solvent-soluble at room temperature.

Here, it is preferred to employ the above silicon compound wherein a is not 0, or its oligomer, since it is thereby possible to form a silicon oxide containing a Si—C bond and it is thereby possible to increase the effect to relax the stress in the dielectric layer. As the above silicon compound wherein a is not 0, a compound wherein a is 1, is preferred. The silicon oxide containing a Si—C bond is preferably formed from the above silicon compound wherein a is not 0 or its oligomer, or a mixture of the above silicon compound wherein a is not 0 and the above silicon compound wherein a is 0, or from an oligomer obtainable from such a mixture. It is particularly preferably formed from the above silicon compound wherein a is 1 or its oligomer, or from a mixture of the above silicon compounds, wherein the above silicon compound wherein a is 1 is the main component, and the average of a is from 0.5 to 1.5, or its oligomer. Especially when the above silicon compound wherein a is 1 or its oligomer is used, holes left when water or an alcohol formed as a byproduct by the condensation reaction of the above organic silicon compound, and a compound formed by partial decomposition of the above R, are fired, will be small, and pinholes will scarcely be formed.

As the above oligomer, a curable organosilicone oligomer such as a curable methyl silicone resin or a curable methyl phenyl silicone resin may also be used. The curable organosilicone resin is a silicone oligomer having an organic group bonded to the silicon atom and a hydroxyl group or an alkoxy group bonded to the silicon atom, and undergoes curing by dehydration or dealcoholization condensation of the hydroxyl group or the alkoxy group bonded to the silicon atom. The curable organosilicone resin is obtained by hydrolytic condensation of a chlorosilane, mainly an organotrichlorosilane. As the organotrichlorosilane, methyltrichlorosilane or phenyltrichlorosilane is used. In some cases, diorganodichlorosilane, tetrachlorosilane, triorganomonochlorosilane or the like undergoes co-condensation together with the organotrichlorosilane. For example, a curable methyl silicone resin is a silicone oligomer having a methyl group bonded to the silicon atom and a hydroxyl group or a methoxy group bonded to the silicon atom, obtained usually by hydrolytic condensation of methyltrichlorosilane and dimethyldichlorosilane.

Further, the composition for forming a dielectric layer of the present invention may contain an organic vehicle. The organic vehicle is one comprising a resin which serves as a binder at the time of coating the substrate with the composition comprising the above-described three components (fine particles of dielectric crystal, glass frit and a silicon compound) and a solvent, as the case requires, and it plays a role of imparting a proper rheology characteristic to the composition depending upon the coating method which will be described hereinafter. As such an organic vehicle, a suitable one may be used depending upon the coating method, etc. For example, in a case where a dielectric layer is to be formed by a screen printing method, a vehicle having a cellulose derivative resin such as ethyl cellulose dissolved in an organic solvent such as α-terpineol, may preferably be employed. Further, in a case where a silicone resin or the like is used as the silicon compound, the silicone resin itself may have a function as a binder or a rheology-adjusting agent, whereby an organic vehicle will not be an essential component.

The composition for forming a dielectric layer of the present invention is prepared by mixing the above-described components in a prescribed ratio. As a mixing method, a known technique may be employed. Specifically, a ball mill, a jet mill or a roll mill may, for example, be employed. Of course, the composition for forming a dielectric layer of the present invention may contain a dispersing agent to help dispersion of the fine particles of dielectric crystal, or various additives to improve the wettability or leveling property of the coated film.

In the composition for forming a dielectric layer of the present invention, the ratio of the content, calculated as oxide, of the fine particles of the dielectric crystal, to the content, calculated as oxide, of the glass frit and the content, calculated as $SiO_2$, of the silicon compound, is preferably [fine particles of dielectric crystal]/[glass frit+silicon compound]=95/5 to 50/50. If the content of the fine particles of dielectric crystal becomes larger than the above range, the mechanical strength of a dielectric layer is likely to be poor, and if it is smaller than the above range, the dielectric constant of a dielectric layer is likely to deteriorate. Thus, either case is undesirable.

Further, the ratio of the content, calculated as oxide, of the glass frit to the content, calculated as $SiO_2$, of the silicon compound, is preferably [glass frit]/[silicon compound]=5/95 to 50/50. If the content of the glass frit is larger than the above range, especially at the time of firing at a high temperature, the above-mentioned problem at the time of employing glass frit, is likely to be not negligible, and if it is smaller than the above range, cracks are likely to be formed in the layer, whereby it tends to be difficult to form a dense dielectric layer. Particularly preferably, [fine particles of dielectric crystal]/[glass frit+silicon compound]=95/5 to 50/50, and [glass frit]/[silicon compound]=5/95 to 50/50.

Now, the MIM capacitor of the present invention can be produced as follows. Usually, a MIM capacitor has a structure wherein a bottom electrode layer/a dielectric layer/a top electrode layer are formed in this order on a substrate having an insulative surface. As the substrate, it is preferred to employ a glass substrate, but a semiconductor substrate such as a silicon substrate or a ceramic substrate may, for example, be suitably employed.

The MIM capacitor of the present invention is constructed so that a dielectric layer is sandwiched by two electrode layers made of conductive films. Here, the two electrode layers (the top electrode layer and the bottom electrode layer) may be made mainly of the same material or may be made of different materials. The conductive films are preferably metal films made mainly of silver, gold, platinum, aluminum, titanium, palladium, rhodium, iridium, ruthenium or the like, but may be a conductive metal oxide film made mainly of indium oxide, tin oxide, zinc oxide, ruthenium oxide or the like. Here, the methods (steps A and C) for forming the top electrode layer and the bottom electrode layer are not particularly limited, and a known method such as a sputtering method, a vacuum deposition method, a chemical vapor deposition method or a coating method, may, for example, be used. Among them, a coating method is preferred, since no special or expensive apparatus will be required, and a conductive film can be formed most inexpensively and simply. For example, a method is preferably employed wherein a conductive paste including a silver paste, or a so-called conductive frit paste containing a conductive filler and glass frit, is applied on a substrate and then fired to form a conductive film. Further, such a conductive film may be formed by laminating different types of films. For example, it is known that if a titanium film and a platinum film are laminated, an electrode having a good adhesion to the substrate can be obtained.

The MIM capacitor of the present invention has, between the above-described two electrode layers, a dielectric layer having a structure such that fine particles of perovskite type dielectric crystal are dispersed in a silicon oxide matrix containing glass-forming ions. This dielectric layer can be formed by applying the composition for forming a dielectric layer of the invention on the bottom electrode layer, drying it and then firing it at a temperature of from 300 to 1,000° C. to form silicon oxide (step B). If the firing temperature is lower than 300° C., no fusion of frit will take place or no adequate condensation of the silicon compound will take place, whereby the mechanical strength or the dielectric constant of the dielectric layer thereby obtained, is likely to be poor. On the other hand, if the firing temperature exceeds 1,000° C., no further improvement of the properties can be obtained, and such is uneconomical. Especially when fine particles of dielectric crystal and/or glass frit of a lead type is employed, sublimation of lead will take place, and the upper limit temperature for firing is required to be carefully set. Further, usually, the upper limit temperature for firing is governed by the heat resistance of the substrate, and, for example, in a case where a dielectric layer is formed on a glass substrate or a conductive film (a bottom electrode)-coated glass substrate, it is preferred to carry out firing by controlling the upper limit temperature for firing at a level of from 600 to 700° C., whereby cracks are not likely to form in the dielectric layer, and warpage of the substrate will also be suppressed. The firing time varies depending upon the temperature or atmosphere, but it is preferably carried out for from 1 minute to 6 hours.

Further, a method for applying the composition for forming a dielectric layer on the bottom electrode layer, is not particularly limited, and a known method may be employed. For example, a screen printing method, a spin coating method, a dip coating method, a spray coating method, a transfer printing method, a curtain flow coating method or a mist method may, for example, be mentioned. Among them, a screen printing method is preferably employed as a method of applying a thick dielectric layer with high precision.

In the MIM capacitor of the present invention, the dielectric layer preferably has a layer thickness of from 1 to 50 µm. If the layer thickness is less than 1 µm, the desired dielectric constant, particularly the withstand voltage properties, are likely to be hardly obtainable, and if the layer thickness exceeds 50 µm, cracks are likely to be formed in the dielectric layer, whereby the dielectric constant is likely to deteriorate. Particularly preferably, the layer thickness of the dielectric layer is made to be from 1 to 30 µm. Further, in a case where a desired layer thickness can not be obtained by a single process comprising coating-drying-firing, such a process may be repeatedly carried out.

Here, if the matrix contains a Si—C bond, the stress in the film of the dielectric layer can be relaxed, whereby formation of e.g. warpage can be prevented, and excellent withstand voltage properties can be obtained, such being preferred. Further, the glass-forming ions in the matrix may preferably contain at least two types of ions selected from the group consisting of lead, bismuth, boron, aluminum, zinc, titanium, tin, zirconium, niobium and tantalum. Especially when the glass-forming ions are ions of at least two types selected from the group consisting of lead, bismuth, boron, aluminum and zinc, such is preferred from the viewpoint of the binding property of fine particles of dielectric crystal and the adhesion to the substrate. Further, it is preferred to employ fine particles of anisotropic crystal as the fine particles of dielectric crystal, whereby the alignment property of the fine particles of dielectric crystal in the dielectric layer will be improved.

After forming a dielectric layer on the bottom electrode layer as described above, a top electrode layer is formed on the dielectric layer to obtain a MIM capacitor of the present invention. The method (step C) for forming the top electrode layer is not particularly limited, and a method equivalent to the method used for forming the bottom electrode layer may be employed. Further, the withstand voltage of the MIM capacitor of the present invention is preferably at least 200 V.

Now, the present invention will be described in further detail with reference to Examples. However, it should be understood that the present invention is by no means restricted to such Examples. Here, evaluation of the electrical properties of the obtained dielectric layer was carried out as follows.

Layer thickness: Measured by means of a surface profilometer (DekTak2020, manufactured by Sloan).

Dielectric constant: Measured at 1 MHz by means of an impedance analyzer (4192A, manufactured by Agilent) and a test set (16451A).

Withstand voltage properties: A DC constant voltage and constant current power source (PAD500-0.6A, manufactured by Kikusui Electronics Corp.) was connected to a sample which was used for the measurement of the dielectric constant, and the voltage and the current at which dielectric breakdown of the sample occurred, were measured by means of a digital multimeter.

EXAMPLE 1

4.43 g of magnesium oxide and 26.58 g of niobium oxide were wet-mixed for one hour in an automatic triturator using a small amount of ethanol, then dried, put into a capped crucible made of alumina and fired in an electric furnace at 1,000° C. for 8 hours. After slow cooling, to the obtained fired powder, 66.9 g of lead oxide was added, and the mixture was wet-mixed, again put into a capped crucible and fired in an electric furnace at 900° C. for 4 hours to obtain fine particles of $Pb(Mg_{1/3}Nb_{2/3})O_3$ (PMN). The formed phase of the obtained fine particles was confirmed by X-ray diffraction and found to be fine particles (average particle size: 800 nm) of crystal made solely of a perovskite phase.

10 Parts by weight of the obtained fine particles of PMN, 0.5 part by weight of glass frit (as represented by mol % based on oxides, $SiO_2$: 58.2%, $Bi_2O_3$: 15.0%, $TiO_2$: 9.0%, $Li_2O$: 15.0%, $Na_2O$: 0.1%, $K_2O$: 2.4%, $CeO_2$: 0.4%, softening point: 565° C.) and 10 parts by weight of α-terpineol containing 10 mass % of ethyl cellulose, were mixed and kneaded for 1 hour in an automatic triturator. Further, 4 parts by weight of methyl trimethoxysilane (MTMS) (content calculated as $SiO_2$: 1.8 parts by weight) and 4 parts by weight of a curable methylsilicone resin (content calculated as $SiO_2$: 2 parts by weight) were added, and the mixture was further kneaded for 1 hour to obtain a paste-form composition for forming a dielectric layer. The composition for forming a dielectric layer was applied on a glass plate (tradename: PD200, manufactured by Asahi Glass Company, Limited) of 50×50 mm having an electrode layer with a thickness of 1 µm preliminarily formed by means of a silver paste by screen printing employing a stainless steel mask (50×50 mm) of 250 mesh, dried at 180° C. for 15 minutes, then put into an electric furnace maintained at 650° C. and fired for 30 minutes. The layer thickness of the obtained dielectric layer was 7 µm. Further, on the dielectric layer, an aluminum electrode (13 mm in diameter) was formed by a vacuum vapor deposition method, to obtain a sample for evaluation of the dielectric constant. The results of evaluation of the electrical properties are shown in Table 1.

EXAMPLE 2

A dielectric layer was formed in the same manner as in Example 1 except that as the silicon compound, 4 parts by weight of phenyltrimethoxysilane (PTMS) (content calculated as $SiO_2$: 1.2 parts by weight) was used instead of the curable methylsilicone resin. The composition of the composition for forming a dielectric layer, the thickness of the obtained dielectric layer, and the results of evaluation of the electrical properties are shown in Table 1.

EXAMPLE 3

A dielectric layer was formed in the same manner as in Example 1 except that as the fine particles of dielectric crystal, fine particles of $Ba_{0.7}Sr_{0.3}TiO_3$ (BST) (average particle size: 80 nm, manufactured by TPL Incorporated) were used instead of the fine particles of PMN. The composition of the composition for forming a dielectric layer, the layer thickness of the obtained dielectric layer and the results of evaluation of the electrical properties are shown in Table 1.

EXAMPLE 4 Comparative Example

A dielectric layer was formed in the same manner as in Example 1 except that no glass frit was incorporated to the composition for forming a dielectric layer. The composition of the composition for forming a dielectric layer, the layer thickness of the obtained dielectric layer and the results of evaluation of the electrical properties are shown in Table 1. As compared with Examples 1 and 2, the withstand voltage is low, which is considered attributable to formation of cracks or pinholes in the dielectric layer.

EXAMPLE 5 Comparative Example

A dielectric layer was formed in the same manner as in Example 1 except that no methyltrimethoxysilane and no curable methylsilicone resin were incorporated to the composition for forming a dielectric layer, and the amount of glass frit was changed to 8 parts by weight. The composition of the composition for forming a dielectric layer, the layer thickness of the obtained dielectric layer, and the results of evaluation of the electrical properties are shown in Table 1. As compared with Examples 1 and 2, the content of the fine particles of dielectric crystal in the dielectric layer was small, and accordingly, the dielectric constant was also low.

TABLE 1

| Example | Fine particles of dielectric crystal/ parts by weight | Glass frit/parts by weight | Silicon compound/ parts by weight calculated as $SiO_2$ | Thickness of dielectric layer/μm | Dielectric constant | Withstand voltage/V |
|---|---|---|---|---|---|---|
| Example 1 | PMN/10 | 0.5 | MTMS/1.8 Curable methylsilicone resin/2 | 7 | 1,600 | 300 |
| Example 2 | PMN/10 | 0.5 | MTMS/1.8 PTMS/1.2 | 6 | 1,600 | 270 |
| Example 3 | BST/10 | 0.5 | MTMS/1.8 Curable methylsilicone resin/2 | 7 | 200 | 450 |
| Example 4 | PMN/10 | — | MTMS/1.8 Curable methylsilicone resin/2 | 7 | 1,100 | 200 |
| Example 5 | PMN/10 | 8 | — | 7 | 300 | 300 |

The composition for forming a dielectric layer of the present invention is useful for preparing a dielectric layer to be used for a MIM capacitor or a dielectric layer to be used for stabilizing the voltage applied to a luminescent layer in an electroluminescence device. Further, in a high frequency device, it can be utilized as a material for a hybrid substrate, since the electric length can thereby be reduced.

Further, by imparting anisotropy to the layer, it may be used as a piezoelectric element.

The entire disclosure of Japanese Patent Application No. 2004-175676 filed on Jun. 14, 2004 including specification, claims and summary are incorporated herein by reference in its entirety.

What is claimed is:

1. A composition for forming a dielectric layer, which comprises fine particles of a perovskite type dielectric crystal, a glass frit having a softening point from 500 to 700° C., and a hydrolysable silicon compound or its oligomer; wherein said composition is capable of forming a dielectric layer having a structure such that fine particles of perovskite type dielectric crystal are dispersed in a silicon oxide matrix containing glass-forming ions.

2. The composition for forming a dielectric layer according to claim 1, wherein the fine particles of the perovskite type dielectric crystal are made of at least one member selected from the group consisting of $Pb(Mg_{1/3}Nb_{2/3})O_3$, $PbTiO_3$, $PbZrO_3$, $BaTiO_3$, $SrTiO_3$ and solid solutions thereof.

3. The composition for forming a dielectric layer according to claim 1, wherein the glass frit contains at least two oxides selected from the group consisting of silicon oxide, lead oxide, bismuth oxide, boron oxide, aluminum oxide and zinc oxide.

4. The composition for forming a dielectric layer according to claim 1, wherein the hydrolysable silicon compound is a hydrolysable silicon compound having a Si-C bond, or its oligomer.

5. The composition for forming a dielectric layer according to claim 1, wherein the ratio of the content, calculated as oxide, of the fine particles of the dielectric crystal, to the content, calculated as oxide, of the glass frit and the content, calculated as $SiO_2$, of the silicon compound, is [fine particles of dielectric crystal]/[glass frit +silicon compound]=95/5 to 50/50.

6. The composition for forming a dielectric layer according to claim 1, wherein the ratio of the content, calculated as oxide, of the glass frit to the content, calculated as $SiO_2$, of the silicon compound, is [glass frit]/[silicon compound]=5/95 to 50/50.

7. The composition for forming a dielectric layer according to claim 5, wherein the ratio of the content, calculated as oxide, of the glass frit to the content, calculated as $SiO_2$, of the silicon compound, is [glass frit]/[silicon compound]=5/95 to 50/50.

8. The composition for forming a dielectric layer according to claim 1, which further contains a liquid medium.

* * * * *